United States Patent
Gotanda et al.

(10) Patent No.: US 9,935,284 B2
(45) Date of Patent: Apr. 3, 2018

(54) PHOTOELECTRIC CONVERSION ELEMENT AND METHOD FOR MANUFACTURING THE SAME

(71) Applicant: KABUSHIKI KAISHA TOSHIBA, Tokyo (JP)

(72) Inventors: Takeshi Gotanda, Yokohama (JP); Yoshihiko Nakano, Yokohama (JP); Katsuyuki Naito, Bunkyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/430,112

(22) Filed: Feb. 10, 2017

(65) Prior Publication Data
US 2017/0155069 A1 Jun. 1, 2017

Related U.S. Application Data

(62) Division of application No. 15/065,322, filed on Mar. 9, 2016, now Pat. No. 9,799,841.

(30) Foreign Application Priority Data
Mar. 18, 2015 (JP) ................. 2015-054321

(51) Int. Cl.
*H01L 21/00* (2006.01)
*H01L 51/42* (2006.01)
(Continued)

(52) U.S. Cl.
CPC ...... *H01L 51/4253* (2013.01); *H01L 51/0003* (2013.01); *H01L 51/4213* (2013.01);
(Continued)

(58) Field of Classification Search
CPC ............ H01L 51/4253; H01L 51/0003; H01L 51/4213; H01L 51/441; H01L 51/005;
(Continued)

(56) References Cited

U.S. PATENT DOCUMENTS 9,087,991 B2 * 7/2015 Kuhn .................... H01L 51/002
2010/0108135 A1 * 5/2010 Morooka ............. H01G 9/2022
136/256
(Continued)

FOREIGN PATENT DOCUMENTS

JP 2006-339199 12/2006
JP 2012-89786 5/2012
(Continued)

OTHER PUBLICATIONS

Michael M. Lee, et al., "Efficient Hybrid Solar Cells Based on Meso-Superstructured Organometal Halide Perovskites", Science, vol. 338, 2012, pp. 643-647 (supporting material 7 pages).
(Continued)

*Primary Examiner* — Thinh T Nguyen
(74) *Attorney, Agent, or Firm* — Oblon, McClelland, Maier & Neustadt, L.L.P.

(57) ABSTRACT

According to one embodiment, a photoelectric conversion element includes a first electrode, a second electrode, a photoelectric conversion layer, and a first layer. The second electrode includes a base member and a first material portion. The base member includes a plurality of structure bodies including carbon. The first material portion includes a carrier transport material and is provided between the structure bodies. The photoelectric conversion layer is provided between the first electrode and the second electrode. The photoelectric conversion layer includes a material having a perovskite structure. The first layer is provided between the photoelectric conversion layer and the second electrode. The first layer includes the carrier transport material.

7 Claims, 4 Drawing Sheets

(51) Int. Cl.
    *H01L 51/00*    (2006.01)
    *H01L 51/44*    (2006.01)
    *H01G 9/20*    (2006.01)
(52) U.S. Cl.
    CPC ......... *H01L 51/441* (2013.01); *H01G 9/2031* (2013.01); *H01G 9/2059* (2013.01); *H01L 51/4226* (2013.01)
(58) Field of Classification Search
    CPC .......... H01L 51/4226; H01G 9/2059; H01G 9/2031; H01G 9/0029; H01G 9/2063
    USPC ........ 438/66, 74, 80, 98, 71, 64, 82; 257/21, 257/22, 32, E51.002, E21.272
    See application file for complete search history.

(56) References Cited

U.S. PATENT DOCUMENTS

| | | | | |
|---|---|---|---|---|
| 2012/0192945 | A1* | 8/2012 | Kuhn | H01L 51/002 136/259 |
| 2016/0260918 | A1 | 9/2016 | Gotanda et al. | |
| 2016/0276110 | A1* | 9/2016 | Suzuka | H01G 9/20 |
| 2016/0276612 | A1 | 9/2016 | Gotanda | |
| 2017/0162809 | A1* | 6/2017 | Fang | H01L 51/442 |

FOREIGN PATENT DOCUMENTS

| | | |
|---|---|---|
| JP | 2014-49551 | 3/2014 |
| JP | 2014-49596 | 3/2014 |
| JP | 2014-49631 | 3/2014 |
| JP | 2014-56940 | 3/2014 |
| JP | 2014-56962 | 3/2014 |
| JP | 2014-72327 | 4/2014 |
| JP | 2016-162911 A | 9/2016 |
| JP | 2016-178156 A | 10/2016 |
| WO | WO 2015/032748 A1 | 3/2015 |

OTHER PUBLICATIONS

Jingbi You, et al., "Low-Temperature Solution-Processed Perovskite Solar Cells with High Efficiency and Flexibility", ACS NANO, 8, 2014, pp. 1674-1680 (supporting information6 pages ).

Agnese Abrusci, et al., "High-Performance Perovskite-Polymer Hybrid Solar Cells via Electronic Coupling with Fullerene, Monolayers", Nano Lett 13, 2013, pp. 3124-3128.

Dianyi Liu, et al., "Perovskite solar cells with a planar heterojunction structure prepared using room-temperature solution processing technique", Nature Photonics, 8, 2013, pp. 133-138 (supplementary information 6 pages).

Anyi Mei, et al., "A hole-conductor-free, fully printable mesoscopic perovskite solar cell with high stability", Science, 345, 2014, pp. 295-298 (supplementary information19 pages).

Zhen Li, et al., "Laminated Carbon Nanotube Networks for Metal Electrode-Free Efficient Perovskite Solar Cells", ACS NANO, 2014, 8, (7), pp. 6797-6804.

* cited by examiner

PHOTOELECTRIC CONVERSION ELEMENT AND METHOD FOR MANUFACTURING THE SAME

CROSS-REFERENCE TO RELATED APPLICATIONS

This application is a divisional application of U.S. application Ser. No. 15/065,322 filed Mar. 9, 2016, which is based upon and claims the benefit of priority from Japanese Patent Application No. 2015-054321, filed on Mar. 18, 2015; the entire contents of each are incorporated herein by reference.

FIELD

Embodiments described herein relate generally to a photoelectric conversion element and a method for manufacturing the same.

BACKGROUND

Photoelectric conversion elements such as solar cells and sensors using an organic photoelectric conversion material or a photoelectric conversion material including an organic substance and an inorganic substance have been searched. Devices may be manufactured at low cost if photoelectric conversion elements are produced by coating or printing a photoelectric conversion material. It is desirable to increase the productivity of such photoelectric conversion elements.

DETAILED DESCRIPTION

Figure 1A:
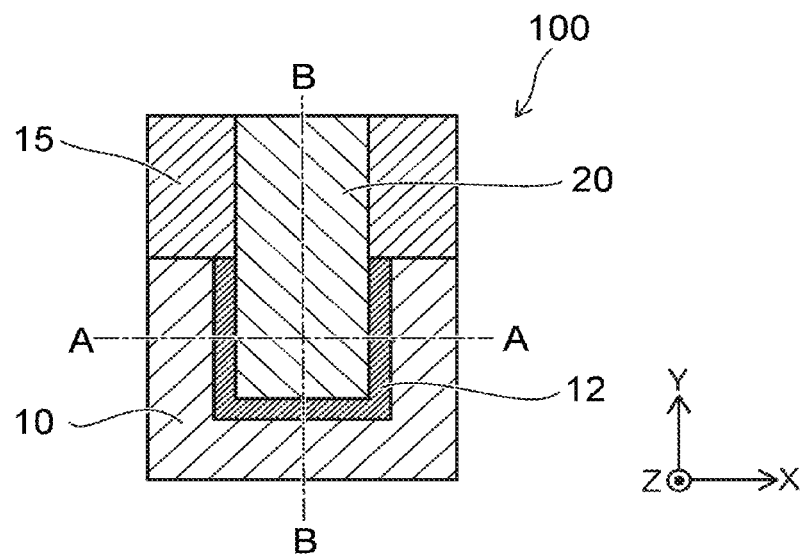
FIG. 1A to FIG. 1C are schematic views showing a photoelectric conversion element according to the embodiment.

According to one embodiment, a photoelectric conversion element includes a first electrode, a second electrode, a photoelectric conversion layer, and a first layer. The second electrode includes a base member and a first material portion. The base member includes a plurality of structure bodies including carbon. The first material portion includes a carrier transport material and is provided between the structure bodies. The photoelectric conversion layer is provided between the first electrode and the second electrode. The photoelectric conversion layer includes a material having a perovskite structure. The first layer is provided between the photoelectric conversion layer and the second electrode. The first layer includes the carrier transport material.

According to one embodiment, a method for manufacturing a photoelectric conversion element is disclosed. The method includes coating a solution including a carrier transport material on a photoelectric conversion layer. The photoelectric conversion layer is provided on a first electrode. The photoelectric conversion layer includes a material having a perovskite structure. The method includes bonding a base member including carbon to the photoelectric conversion layer. The base member is impregnated with a solution including the carrier transport material.

Various embodiments of the invention will be described hereinafter with reference to the accompanying drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described in regard to a drawing thereinabove are marked with like reference numerals, and a detailed description is omitted as appropriate.

First Embodiment

Figure 1B:
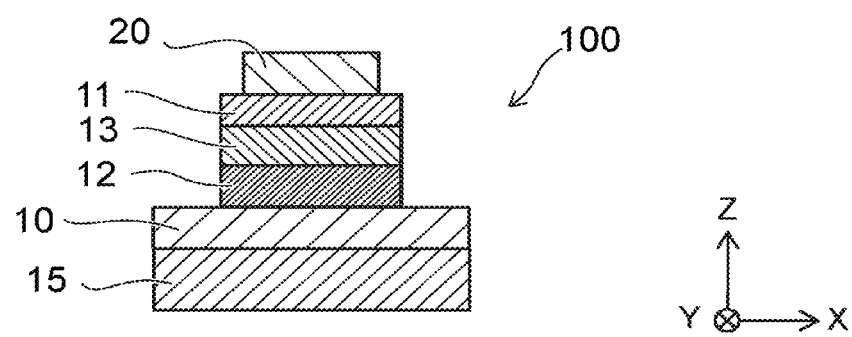
Figure 1C:
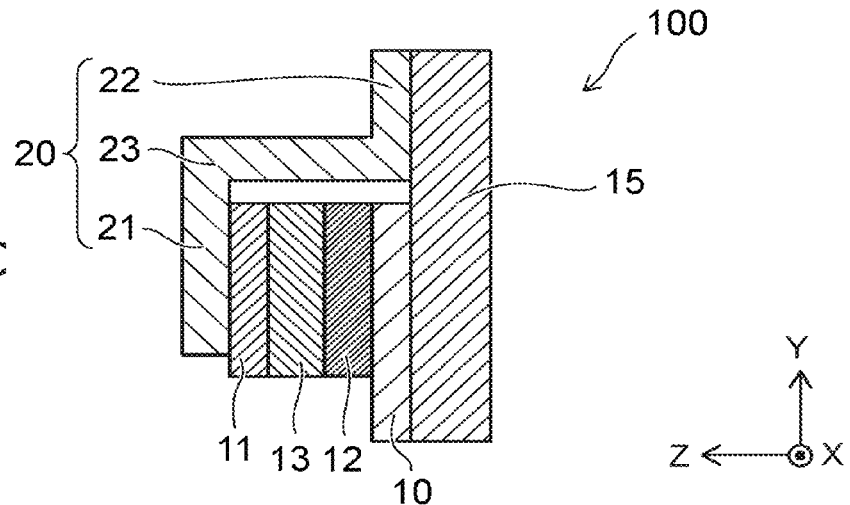

FIG. 1A to FIG. 1C are schematic views showing a photoelectric conversion element according to the embodiment.

FIG. 1A is a schematic plan view showing the photoelectric conversion element 100 according to the embodiment. FIG. 1B is a schematic cross-sectional view of the photoelectric conversion element 100 along cross-section A-A shown in FIG. 1A. FIG. 1C is a schematic cross-sectional view of the photoelectric conversion element 100 along cross-section B-B shown in FIG. 1A.

As shown in FIG. 1A to FIG. 1C, the photoelectric conversion element 100 includes a first electrode 10, a second electrode 20, a first layer 11, an intermediate layer 12, and a photoelectric conversion layer 13. The photoelectric conversion element 100 further includes a substrate 15. The photoelectric conversion element 100 is, for example, a solar cell or a sensor.

In this specification, a stacking direction from the first electrode 10 toward the photoelectric conversion layer 13 is taken as a Z-axis direction. One direction perpendicular to the Z-axis direction is taken as an X-axis direction. A direction perpendicular to the X-axis direction and perpendicular to the Z-axis direction is taken as a Y-axis direction.

The first electrode 10 is provided on one portion of the substrate 15. The first electrode 10 is, for example, one of a positive electrode or a negative electrode.

The second electrode 20 is provided on the substrate 15 and is separated from the first electrode 10.

As shown in FIG. 1C, the second electrode 20 includes a first region 21, a second region 22, and a third region 23. The first region 21 is provided on the first electrode 10 and is separated from the first electrode 10 in the Z-axis direction. The second region 22 is separated from the first electrode 10 in the Y-axis direction. The third region 23 connects the first region 21 to the second region 22. The second electrode 20 is, for example, the other of the positive electrode or the negative electrode.

The photoelectric conversion layer 13 is provided between the first electrode 10 and the second electrode 20 (the first region 21). The photoelectric conversion layer 13 includes a material having a perovskite structure. For example, the photoelectric conversion layer 13 is formed by coating.

The first layer 11 is provided between the second electrode 20 (the first region 21) and the photoelectric conversion layer 13. The first layer 11 is, for example, a first buffer layer.

The intermediate layer 12 is provided between the first electrode 10 and the photoelectric conversion layer 13. The intermediate layer 12 is, for example, a second buffer layer.

For example, light is incident on the photoelectric conversion layer 13 via the substrate 15, the first electrode 10, and the intermediate layer 12. Or, the light is incident on the photoelectric conversion layer 13 via the second electrode 20 and the first layer 11. At this time, electrons or holes are generated by the light incident on the photoelectric conversion layer 13.

The first layer 11 is, for example, a first charge transport layer. In the example, the first layer 11 is a hole transport layer. The hole transport layer efficiently transports holes and blocks electrons. The holes that are excited in the photoelectric conversion layer 13 are extracted from the second electrode 20 via the first layer 11.

The intermediate layer 12 is, for example, a second charge transport layer. In the example, the intermediate layer 12 is an electron transport layer. The electron transport layer efficiently transports electrons and blocks holes. The electrons that are excited in the photoelectric conversion layer 13 are extracted from the first electrode 10 via the intermediate layer 12.

Thus, electricity corresponding to the light incident on the photoelectric conversion element 100 is extracted via the first electrode 10 and the second electrode 20.

Examples of members included in the photoelectric conversion element according to the embodiment will now be described.

Substrate 15

For example, the substrate 15 supports the other members (the first electrode 10, the second electrode 20, the first layer 11, the intermediate layer 12, and the photoelectric conversion layer 13). An electrode may be formed on the substrate 15. It is favorable for the material included in the substrate 15 not to be altered by heat or organic solvents. The substrate 15 is, for example, a substrate including an inorganic material, a plastic substrate, a polymer film, a metal substrate, etc. Alkali-free glass, quartz glass, etc., may be used as the inorganic material. Polyethylene, polyethylene terephthalate (PET), polyethylene naphthalate (PEN), polyimide, polyamide, polyamide-imide, a liquid crystal polymer, a cycloolefin polymer, etc., may be used as the materials of the plastic and the polymer film. Stainless steel (SUS), titanium, silicon, etc., may be used as the material of the metal substrate.

In the case where the substrate 15 is disposed on the side of the photoelectric conversion element 100 where the light is incident, the substrate 15 includes a material (e.g., a transparent) material having a high light transmittance. The thickness of the substrate 15 is not particularly limited as long as the substrate 15 has sufficient strength to support the other components.

In the case where the substrate 15 is disposed on the side of the photoelectric conversion element 100 where the light is incident, for example, an anti-reflection film having a moth-eye structure is mounted on the light incident surface. Thereby, the light is received efficiently; and it is possible to increase the energy conversion efficiency of the cell. The moth-eye structure is a structure including a regular protrusion array of about 100 nanometers (nm) in the surface. Due to the protrusion structure, the refractive index changes continuously in the thickness direction. Therefore, by interposing the anti-reflection film, a discontinuous change of the refractive index can be reduced. Thereby, the reflections of the light decrease; and the cell efficiency increases.

First Electrode 10

The material of the first electrode 10 is not particularly limited as long as the material is conductive. For example, a conductive material that is transparent or semi-transparent is used as the material of the first electrode 10. The first electrode 10 is formed by vacuum vapor deposition, sputtering, ion plating, plating, coating, etc. A conductive metal oxide film, a semi-transparent metal thin film, etc., may be used as the electrode material that is transparent or semi-transparent.

Specifically, a conductive compound, gold, platinum, silver, copper, or the like is used as the electrode material that is transparent or semi-transparent. Indium oxide, zinc oxide, tin oxide, a complex of these substances such as indium-tin-oxide (ITO), fluorine-doped tin oxide (FTO), or indium-zinc-oxide, an organic material including polyethylene dioxythiophene, etc., may be used as the material of the conductive compound. It is particularly favorable for ITO or FTO to be used as the material of the conductive compound. An organic conductive polymer such as polyaniline, a derivative of polyaniline, polythiophene, a derivative of polythiophene, etc., may be used as the electrode material.

In the case where the material of the first electrode 10 is ITO, it is favorable for the thickness of the first electrode 10 to be not less than 30 nm and not more than 330 nm. In the case where the thickness of the first electrode 10 is thinner than 30 nm, the conductivity decreases; and the resistance becomes high. A high resistance may cause the conversion efficiency to decrease. In the case where the thickness of the first electrode 10 is thicker than 330 nm, the flexibility of the ITO becomes low. Therefore, there are cases where the ITO breaks when stress is applied.

It is favorable for the sheet resistance of the first electrode 10 to be as low as possible; and it is favorable to be 10 ohm/square ($\Omega/\square$) or less. The first electrode 10 may be a single layer and may have a structure in which layers including materials having different work functions are stacked.

In the case where the first electrode 10 extracts the electrons, it is favorable to use a material having a low work function as the material of the first electrode 10. For example, an alkaline metal, an alkaline earth metal, etc., may be used as the material having the low work function. Specifically, lithium (Li), indium (In), aluminum (Al), calcium (Ca), magnesium (Mg), samarium (Sm), terbium (Tb), ytterbium (Yb), zirconium (Zr), sodium (Na), potassium (K), rubidium (Rb), cesium (Cs), barium (Ba), or an alloy of these elements may be used.

An alloy of at least one of the materials having low work functions described above and at least one of gold (Au), silver (Ag), platinum (Pt), copper (Cu), manganese (Mn), titanium (Ti), cobalt (Co), nickel (Ni), tungsten (W), or tin (Sn) may be used. Examples of the alloy include a lithium-aluminum alloy, a lithium-magnesium alloy, a lithium-indium alloy, a magnesium-silver alloy, a calcium-indium alloy, a magnesium-aluminum alloy, an indium-silver alloy, a calcium-aluminum alloy, etc.

In the case where the first electrode 10 extracts the electrons, it is favorable for the thickness of the first electrode 10 to be not less than 1 nm and not more than 500 nm. It is more favorable for the thickness of the first electrode 10 to be not less than 10 nm and not more than 330 nm. In the case where the thickness of the first electrode 10 is thinner than 1 nm, the resistance becomes too high; and there are cases where the charge that is generated cannot be conducted sufficiently to the external circuit. In the case where the thickness of the first electrode 10 is thicker than 500 nm, a long period of time is necessary to form the electrode. Therefore, the material temperature increases; and there are cases where the other materials are damaged and the performance degrades. Because a large amount of material is used, the time occupied by the apparatus (the film formation apparatus) that forms the electrode lengthens which may increase the cost.

Second Electrode 20

Figure 2A:
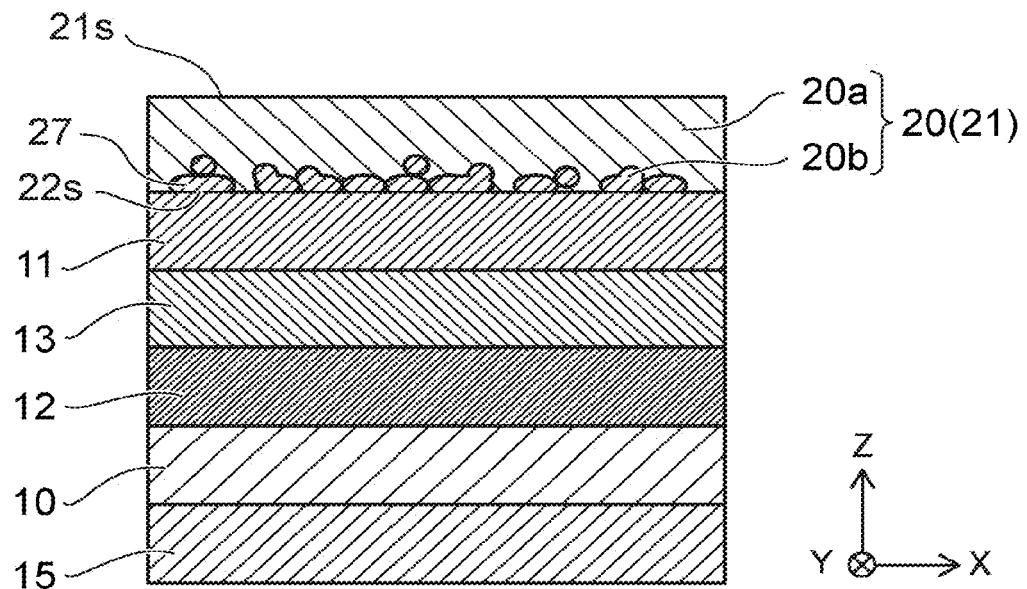
FIG. 2A and FIG. 2B are schematic cross-sectional views showing the photoelectric conversion element according to the embodiment.
Figure 2B:
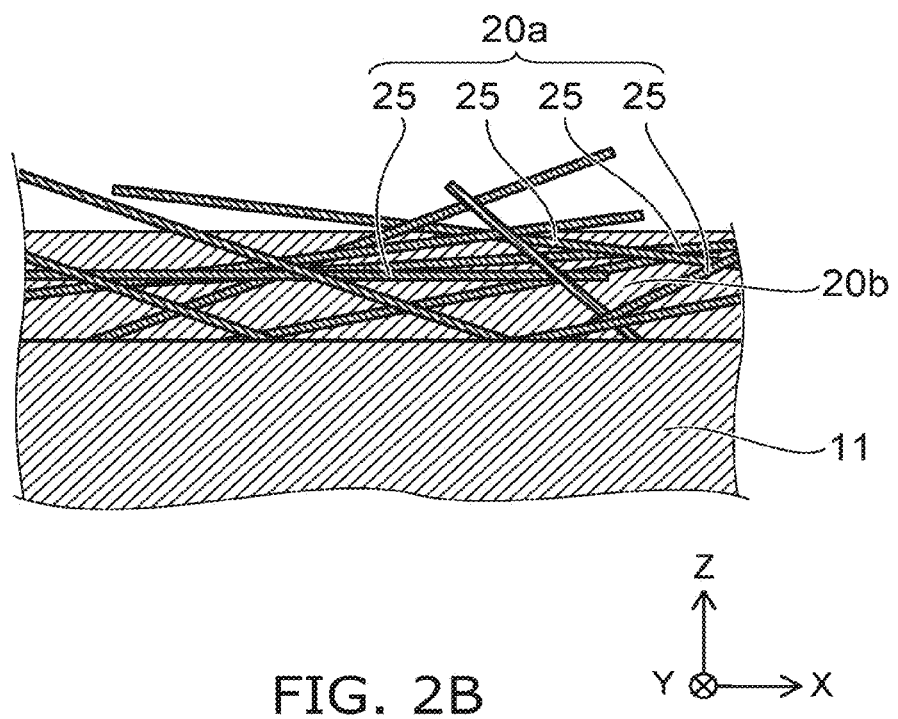

FIG. 2A and FIG. 2B are schematic cross-sectional views showing the photoelectric conversion element according to the embodiment.

FIG. 2A shows one portion of a cross section in the X-Z plane of the photoelectric conversion element 100. FIG. 2B shows an enlarged portion of the first layer 11 and an enlarged portion of the second electrode 20 (the first region 21) shown in FIG. 2A.

As shown in FIG. 2A, the first region 21 of the second electrode 20 includes a base member 20a and a first material portion 20b. The base member 20a includes carbon. The configuration of the base member 20a is, for example, a sheet configuration.

The base member 20a may include carbon paper or a carbon sheet. The second electrode 20 is, for example, a carbon electrode. For example, the second electrode 20 may be formed by adhering, onto the first layer 11, carbon paper impregnated with a material (a first material) having the carrier transport property of the first layer 11. In the second electrode 20, similarly to the first region 21, the second region 22 and the third region 23 may include carbon paper (the base member 20a) and the first material (the first material portion 20b).

For example, the member that is used as the base member 20a has multiple holes. It is favorable for the member that is used as the base member 20a to have through-holes. For example, it is favorable for the diameter of the through-holes to be within the range of not less than 10 nm and not more than 1000 μm.

The base member 20a may be in a state of being supported by a substrate of a material different from the base member 20a. The base member 20a may include at least one of graphene or carbon nanotubes. The base member 20a may include boron. For example, the work function of the second electrode 20 can be adjusted by doping boron into the base member 20a.

The base member 20a has a first surface 21s and a second surface 22s. The second surface 22s is the surface on the first layer 11 side. The first surface 21s is the surface on the side opposite to the second surface 22s. In other words, the second surface 22s is positioned between the first surface 21s and the first layer 11.

As shown in FIG. 2B, the base member 20a includes, for example, multiple structure bodies 25 including carbon. Therefore, an unevenness is formed in the second surface 22s of the base member 20a. The maximum height Rmax of the unevenness of the second surface 22s is, for example, not less than 1 nm and not more than 300 nm. It is favorable for the maximum height Rmax of the second surface 22s to be about 19.5 nm. The "maximum height Rmax" is the height of the highest position measured from the lowest position in a range of the profile curve of the surface of the object having a reference length L. Here, the reference length L is 1 μm or more.

The surface roughness of the second surface 22s may be different from the surface roughness of the first surface 21s. For example, the second surface 22s is flatter than the first surface 21s.

For example, in the case where the base member 20a includes carbon paper, surface treatment of the surface of the carbon paper used to form the second surface 22s is performed. Thereby, the second surface 22s side of the base member 20a is used as a microporous layer 27. The size of the holes in the microporous layer is smaller than the size of the holes in the regions other than the microporous layer. Thereby, the flatness of the second surface 22s can be improved.

The structure of the base member 20a is, for example, a structure in which a fibrous substance is in contact or is partially formed as one body. In other words, fibers that have a length L1 in a first direction (the longitudinal direction) that is longer than a length L2 in a second direction (the lateral direction) intersecting the first direction are in contact or are partially formed as one body. The diameter (the width along the second direction) of the structure bodies 25 is not less than 0.1 nm and not more than 100 μm. The structure bodies 25 may include carbon fibers such as those recited above. However, the configurations of the structure bodies 25 of the embodiment are not limited to the examples recited above.

The first material portion 20b is a portion that includes the material (the first material) included in the first layer 11. For example, the first material portion 20b is formed by impregnating the base member 20a with a solution including the first material and by subsequently drying the solvent. At this time, one portion of the solvent can be evaporated via the through-holes of the base member 20a. At this time, the first material portion 20b is a dried solid of the solution.

The first material portion 20b is provided between the multiple structure bodies 25. The first material portion 20b is provided around at least one portion of the structure bodies 25 and contacts the structure bodies 25. In other words, the second electrode 20 has a structure in which the base member 20a includes the first material. For example, the structure bodies 25 are disposed inside the first material portion 20b.

In the example, the first material portion 20b is positioned on the first layer 11 side of the second electrode 20 and contacts the first layer 11. However, the first material portion 20b may be formed over the entire second electrode 20. For example, the first material portion 20b may contact the structure bodies 25 positioned at the first surface 21s.

For example, the configurations and structures of the base member 20a, the structure bodies 25, and the first material portion 20b described above can be confirmed by observing the cross section of the photoelectric conversion element using a transmission electron microscope (Transmission Electron Microscopy (TEM)).

Photoelectric Conversion Layer 13

The photoelectric conversion layer 13 may include a material having a perovskite structure. The perovskite structure is made of an ion A, an ion B, and an ion X and can be expressed as $ABX_3$. The structure may be a perovskite structure when the ionic radius of the ion B is small compared to that of the ion A. The perovskite structure has a cubic unit lattice. The ion A is disposed at each corner of the cubic crystal; the ion B is disposed at the body center of the cubic crystal; and the ion X is disposed at each face center of the cubic crystal centered around the ion B.

The orientation of the $BX_6$ octahedron distorts easily due to interactions with the ions A. Due to the decrease of the symmetry, a Mott transition occurs; and valence electrons localizing at the ions M can spread as a band. It is favorable for the ion A to be $CH_3NH_3$. It is favorable for the ion B to be at least one of Pb or Sn. It is favorable for the ion X to be at least one of Cl, Br, or I. Each of the materials of the ion A, the ion B, and the ion X may be a single material or a mixed material.

First Layer 11 and Intermediate Layer 12

One of the first layer 11 or the intermediate layer 12 is a hole transport layer. The other of the first layer 11 or the intermediate layer 12 is an electron transport layer. In the example as described above, the first layer 11 is a hole transport layer. However, the first layer 11 may be an electron transport layer. In the example, the intermediate layer 12 is an electron transport layer. However, the intermediate layer 12 may be a hole transport layer.

It is favorable for the materials of the first layer 11 and the intermediate layer 12 to be a halogen compound or a metal oxide. LiF, LiCl, LiBr, LiI, NaF, NaCl, NaBr, NaI, KF, KCl, KBr, KI, and CsF are examples of the halogen compound. LiF is a more favorable example of the halogen compound. Titanium oxide, molybdenum oxide, vanadium oxide, zinc oxide, nickel oxide, lithium oxide, calcium oxide, cesium oxide, and aluminum oxide are examples of the metal oxide.

For example, the electron transport layer has a function of efficiently transporting electrons. A metal oxide may be used as the material of the electron transport layer. For example, amorphous titanium oxide obtained by hydrolysis of titanium alkoxide by a sol-gel method, etc., may be used as the metal oxide.

The method for forming the electron transport layer is not particularly limited as long as the method can form a thin film. For example, spin coating may be used as the method for forming the electron transport layer. In the case where titanium oxide is used as the material of the electron transport layer, it is desirable for the thickness of the electron transport layer to be not less than 5 nm and not more than 20 nm. In the case where the thickness of the electron transport layer is thinner than 5 nm, the hole blocking effect decreases. Therefore, the excitons that are generated deactivate before dissociating into electrons and holes; and a current cannot be extracted efficiently. In the case where the thickness of the electron transport layer is thicker than 20 nm, compared to the case where the thickness of the electron transport layer is 20 nm or less, the resistance of the electron transport layer becomes large; and the current that is generated may be limited. Thereby, the light conversion efficiency may decrease. It is desirable for the solution that is coated in the formation of the electron transport layer to be pre-filtered using a filter.

After the material of the electron transport layer is coated to have a specified thickness, heating and drying are performed using a hotplate, etc. The heating and the drying of the coated material of the electron transport layer are performed while promoting hydrolysis in air at not less than 50° C. and not more than 100° C. for several minutes to about 10 minutes. For example, metal calcium, etc., may be used as the material of the inorganic substance included in the electron transport layer.

The first layer 11 and the intermediate layer 12 may be doped carrier transport layers. In such a case, a doped p-type organic semiconductor or a doped n-type organic semiconductor may be used as the materials of the first layer 11 and the intermediate layer 12. A transport material such as doped spiro-OMeTAD (2,2',7,7'-tetrakis-(N,N-di-4-methoxyphenylamino)-9,9'-spirobifluorene), etc., may be used as the materials of the first layer 11 and the intermediate layer 12. As the doping material (the dopant), for example, oxygen, lithium-bis(trifluoromethanesulfonyl)imide (Li-TFSI), tris[2-(1H-pyrazol-1-yl)pyridine]cobalt(III)trisHhexafluorophosphate (FK102), and tris[2-(1H-pyrazol-1-yl)pyrimidine]cobalt(III)tris[bis(trifluoromethylsulfonyl)imide] (MY11) may be used.

An example of a method for manufacturing the photoelectric conversion element 100 according to the embodiment will now be described.

FIG. 3A to FIG. 3E are schematic cross-sectional views showing the method for manufacturing the photoelectric conversion element according to the embodiment.

In the example, the substrate 15 includes a glass plate. The first electrode 10 includes ITO. The first layer 11 is formed as the electron transport layer using titanium oxide. The intermediate layer 12 is formed as the hole transport layer using spiro-OMeTAD as a major component. A perovskite layer is formed from methylammonium iodide and lead iodide as the photoelectric conversion layer 13. Carbon paper is used as the base member 20a of the second electrode 20.

Figure 3A:
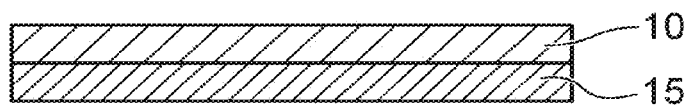
FIG. 3A to FIG. 3E are schematic cross-sectional views showing the method for manufacturing the photoelectric conversion element according to the embodiment.

As shown in FIG. 3A, the first electrode 10 is formed on the substrate 15. For example, ITO is formed using sputtering.

Figure 3B:
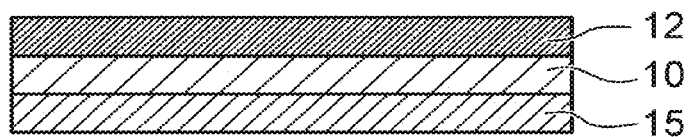

Subsequently, as shown in FIG. 3B, the intermediate layer 12 is formed on the first electrode 10. For example, a titanium di-isopropoxide-bis(acetylacetonate) solution is coated several times on the first electrode 10 using spin coating; and subsequently, baking is performed at 400° C. Thereby, a titanium oxide layer is formed as the intermediate layer 12.

Figure 3C:
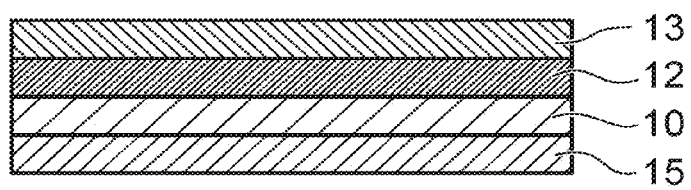

Subsequently, as shown in FIG. 3C, the photoelectric conversion layer 13 is formed on the intermediate layer 12. For example, a DMF (N,N-dimethylformamide) solution that includes methylammonium iodide and lead iodide is coated by spin coating in a nitrogen atmosphere; and subsequently, annealing is performed at 90° C. for 3 hours. Thereby, a perovskite layer is formed as the photoelectric conversion layer 13. The molar amount of methylammonium iodide inside the DMF solution is equal to the molar amount of lead iodide inside the DMF solution.

Figure 3D:
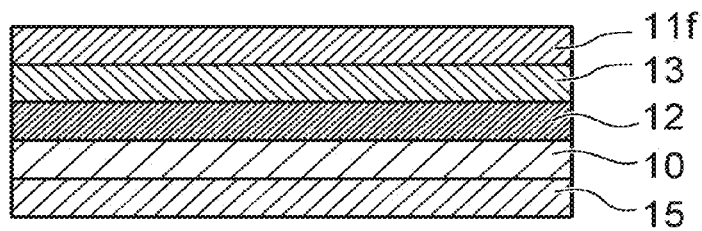

Subsequently, as shown in FIG. 3D, a solution film 11$f$ is formed by coating a solution including the first material (the material of the first layer 11) on the photoelectric conversion layer 13. In the example, the first material is the material of the hole transport layer. At least one portion of the solution film 11$f$ is used to form the first layer 11. For example, a solution in which 28.5 micro liters (μL) of 4-tert-butylpyridine and 17.5 μL of a Li-TFSI solution (a solution including 520 mg of Li-TFSI in 1 ml of acetonitrile) are added to a chlorobenzene solution that includes 80 mg/ml of spiro-OMeTAD is coated by spin coating on the photoelectric conversion layer 13.

Figure 3E:
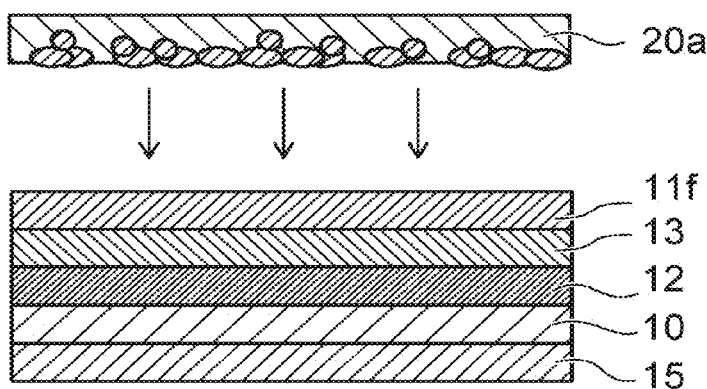

Subsequently, as shown in FIG. 3E, the base member 20a (in the example, carbon paper) impregnated with a solution including the first material is overlaid on the solution film 11$f$. Subsequently, the solvent of the first material is evaporated by drying. Thereby, the first layer 11 and the second electrode 20 are formed.

In the embodiment as described above, first, the first electrode 10, the intermediate layer 12, and the photoelectric conversion layer 13 are stacked on the substrate 15. Then, the photoelectric conversion element 100 can be formed by bonding the base member 20a to the photoelectric conversion layer 13 on which the solution including the first material is coated. Also, the base member 20a that is impregnated with the liquid including the first material may be overlaid on the photoelectric conversion layer 13 without preforming the first layer 11; and subsequently, the first layer 11 may be formed of the first material included in the base member 20a when drying. Further, the base member 20a that does not include the first material may be bonded to the photoelectric conversion layer 13 before the coated film of the first layer 11 dries. Further, the base member 20a that does not include the first material may be bonded to the photoelectric conversion layer 13 after the first layer 11 is formed on the photoelectric conversion layer 13 and dissolved again using a solvent.

The characteristics of the photoelectric conversion element 100 that was thus formed were evaluated after leaving the photoelectric conversion element 100 inside dry air for 12 hours. The IV characteristics can be confirmed by evaluating using a solar simulator. A conversion efficiency of 10% or more is obtained for the photoelectric conversion element 100. It can be seen that the performance after 1000 hours is maintained at 90% or more of the initial performance when evaluating the durability of the photoelectric conversion element 100 according to JIS C 8938 B-1-1995.

For example, in a photoelectric conversion element 109 of a reference example, the second electrode 20 includes gold but does not include carbon paper. In the formation of the photoelectric conversion element 109 of the reference example, a hole transport layer that includes spiro-OMeTAD is formed as the first layer on the photoelectric conversion layer. The coating liquid that is used in the formation of the hole transport layer of the photoelectric conversion element 109 is the same as the solution used for the solution film 11f of the photoelectric conversion element 100. The hole transport layer is formed by the coating liquid being coated onto the photoelectric conversion layer by spin coating and by subsequently being left inside dry air for 12 hours. Subsequently, the electrode is formed by vapor-depositing gold on the hole transport layer. Otherwise, the photoelectric conversion element 109 of the reference example is similar to the photoelectric conversion element 100 according to the embodiment. It can be seen that the performance after 1000 hours is maintained at about 10% of the initial performance when evaluating the durability of the photoelectric conversion element 109 according to JIS C 8938 B-1-1995.

In the photoelectric conversion element 100 according to the embodiment, for example, the second electrode 20 is formed by bonding the base member 20a impregnated with the precursor solution of the first layer 11 to the stacked body coated with the precursor solution of the first layer 11. For example, a roll-to-roll method can be used to manufacture such a photoelectric conversion element 100. Thereby, the throughput can be improved compared to the case where a metal electrode is formed using vapor deposition as in the photoelectric conversion element 109. Moreover, because carbon paper can be used as the electrode, the manufacturing cost can be lower compared to the case where gold which is expensive is used. Accordingly, the productivity of the photoelectric conversion element can be increased.

In the photoelectric conversion element 100 according to the embodiment, the second electrode 20 has a structure in which the base member 20a is impregnated with the material of the first layer 11. The use of such a second electrode 20 corresponds to substantially increasing the contact surface area between the second electrode 20 and the first layer 11. Therefore, compared to the photoelectric conversion element 109 of the reference example, the efficiency of extracting the charge from the second electrode 20 can be increased.

For example, a method may be considered in which the photoelectric conversion element is formed without providing the first layer 11. For example, the precursor solution of the photoelectric conversion layer is coated onto the electron transport layer; and the electrode is formed by overlaying carbon paper that is impregnated with the precursor solution of the photoelectric conversion layer on the coated precursor solution of the photoelectric conversion layer. The structure of the electrode thus formed is impregnated with the material of the photoelectric conversion layer. The use of such an electrode corresponds to increasing the surface area of the interface of the photoelectric conversion layer. However, the material that has the perovskite structure and is included in the photoelectric conversion layer has low durability to moisture and the external air. Therefore, the durability of the photoelectric conversion element may decrease when increasing the surface area of the interface of the photoelectric conversion layer. Conversely, in the photoelectric conversion element 100 according to the embodiment, the second electrode 20 is provided on the first layer 11. Therefore, the decrease of the durability is suppressed; and the productivity of the photoelectric conversion element can be increased.

Second Embodiment

Figure 4A:
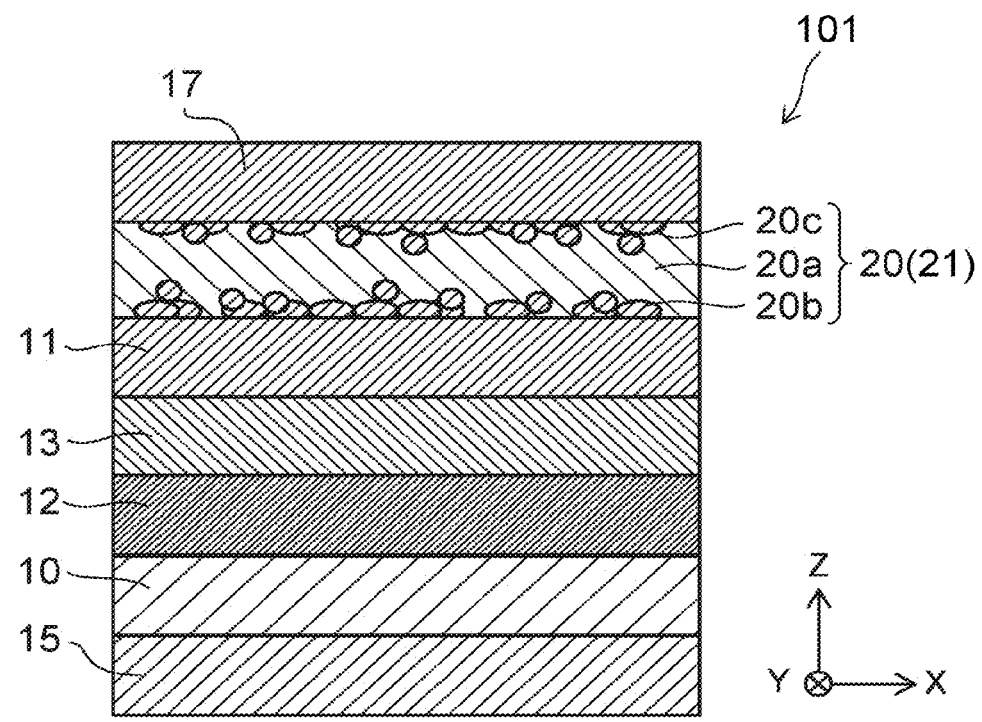
FIG. 4A and FIG. 4B are schematic cross-sectional views showing a photoelectric conversion element according to a second embodiment.
Figure 4B:
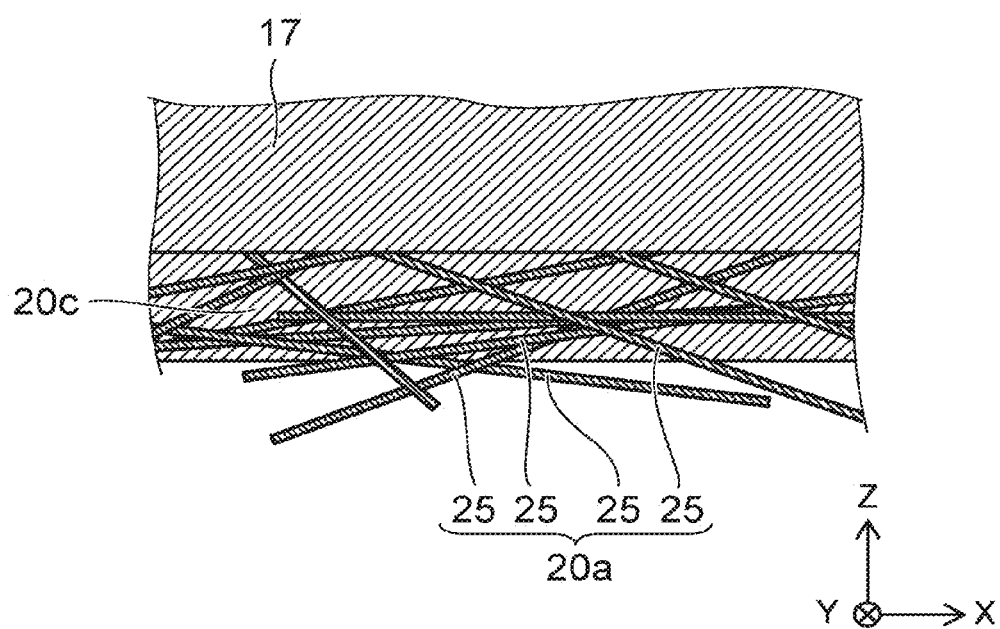

FIG. 4A and FIG. 4B are schematic cross-sectional views showing a photoelectric conversion element according to a second embodiment.

FIG. 4A is a schematic cross-sectional view showing one portion of the photoelectric conversion element 101 according to the embodiment. Compared to the first embodiment, the photoelectric conversion element 101 further includes a second layer 17. Compared to the first embodiment, the second electrode 20 of the photoelectric conversion element 101 further includes a second material portion 20c. Otherwise, a description similar to that of the photoelectric conversion element 100 according to the first embodiment is applicable to the photoelectric conversion element 101 according to the embodiment.

As shown in FIG. 4A, the second layer 17 is provided on the second electrode 20. In other words, the second electrode 20 is provided between the second layer 17 and the first layer 11.

For example, the second layer 17 is provided as a moisture-resistant layer. The second layer 17 includes, for example, a material (a second material) that is moisture-resistant. For example, the second layer 17 may include a polymer compound, a fluorine compound, or a metal oxide, and is not constrained as long as a moisture-resistant effect is obtained. The polymer compound is not constrained as long as a moisture-resistant effect is obtained and may include poly-methyl methacrylate (PMMA), a silicone resin, an ethylene-vinylacetate copolymer, etc. Here, the moisture resistance refers to a function of suppressing the penetration of moisture into the photoelectric conversion layer 13, the first layer 11, the intermediate layer 12, etc. For example, the evaluation of the penetration amount of moisture is performed by analyzing the concentrations of the photoelectric conversion layer 13, the first layer 11, the intermediate layer 12, etc., after the completed photoelectric conversion element is placed in an atmosphere of 85% humidity at 85° C. for 1 hour or more. Thereby, the effect of the second layer 17 can be compared. In such a case, for example, elemental mapping using a transmission electron microscope (TEM), time-of-flight secondary ion mass spectrometry (a time-of-flight secondary ion mass spectrometer (TOF-SIMS)), Auger electron spectrometry, X-ray photoelectron spectroscopy (XPS), etc., can be used to analyze each layer. However, the method that is used to analyze each layer is not constrained as long as the method can detect moisture. It is desirable for the moisture to be 1% or less. The IV characteristics as a solar cell degrade because the photoelectric conversion layer undesirably loses its perovskite structure due to moisture. The IV characteristics as a solar cell degrade because the carrier transport characteristics of the first layer 11 and the intermediate layer 12 change.

The second material portion 20c is a portion of the second electrode 20 including the material (the second material) included in the second layer 17. The second material portion 20c is provided between the second layer 17 and the first layer 11 and contacts the second layer 17. In the example of FIG. 4A, the second material portion 20c is provided between the second layer 17 and the first material portion 20b.

For example, similarly to the first embodiment, carbon paper impregnated with a solution including the first material is overlaid on the photoelectric conversion layer 13 and dried. Subsequently, a solution that includes the second material is coated onto the base member 20a. Thereby, the second layer is formed. When coating, the base member 20a is impregnated with the solution including the second material. Thereby, the second material portion 20c is formed.

FIG. 4B shows an enlarged portion of the second layer 17 and an enlarged portion of the second electrode 20 shown in FIG. 4A.

As shown in FIG. 4B, the second electrode 20 has a structure including the second material. The second material portion 20c is provided between the multiple structure bodies 25. The second material portion 20c is provided around at least one portion of the structure bodies 25 and contacts the structure bodies 25.

The photoelectric conversion element 101 can be manufactured by coating a solution of PMMA by spin coating on a photoelectric conversion element formed similarly to the manufacturing method described in the first embodiment. It can be seen that the performance after 1000 hours is maintained at 90% of the initial performance when evaluating the durability of the photoelectric conversion element according to JIS C 8938 B-1-1995.

As described above, the material that has a perovskite structure and is included in the photoelectric conversion layer has low durability to moisture and the external air. Conversely, the durability of the photoelectric conversion element can be improved by forming the second layer 17 as the moisture-resistant layer on the second electrode 20 as in the embodiment.

In the case where gold is included in the electrode as in the photoelectric conversion element 109 according to the reference example described above, it is difficult to form the moisture-resistant layer by coating on the electrode. Conversely, in the embodiment, the second electrode 20 includes, for example, carbon paper. Therefore, the moisture-resistant layer can be formed on the second electrode 20 by a simple method such as coating. Accordingly, according to the embodiment, the productivity of a photoelectric conversion element having high durability can be increased.

According to the embodiment, a photoelectric conversion element and a method for manufacturing the photoelectric conversion element that have high productivity can be provided.

Hereinabove, embodiments of the invention are described with reference to specific examples. However, the embodiments of the invention are not limited to these specific examples. For example, one skilled in the art may similarly practice the invention by appropriately selecting specific configurations of components such as the first electrode, the second electrode, the base member, the photoelectric conversion layer, the first layer, etc., from known art; and such practice is within the scope of the invention to the extent that similar effects can be obtained.

Any two or more components of the specific examples may be combined within the extent of technical feasibility and are within the scope of the invention to the extent that the spirit of the invention is included.

All photoelectric conversion elements and methods for manufacturing photoelectric conversion elements practicable by an appropriate design modification by one skilled in the art based on the photoelectric conversion elements and the methods for manufacturing photoelectric conversion elements described above as embodiments of the invention are within the scope of the invention to the extent that the spirit of the invention is included.

Various modifications and alterations within the spirit of the invention will be readily apparent to those skilled in the art; and all such modifications and alterations should be seen as being within the scope of the invention.

While several embodiments of the invention are described, these embodiments are presented as examples and are not intended to limit the scope of the invention. These novel embodiments may be implemented in other various forms; and various omissions, substitutions, and modifications can be performed without departing from the spirit of the invention. Such embodiments and their modifications are within the scope and spirit of the invention and are included in the invention described in the claims and their equivalents.

What is claimed is:

1. A method for manufacturing a photoelectric conversion element, comprising:
    coating a solution including a carrier transport material on a photoelectric conversion layer, the photoelectric conversion layer being provided on a first electrode, the photoelectric conversion layer including a material having a perovskite structure; and
    bonding a base member including carbon to the photoelectric conversion layer by a roll-to-roll method, the base member being impregnated with a solution including the carrier transport material.

2. The method according to claim 1, wherein the base member has a sheet configuration.

3. The method according to claim 1, wherein the base member is carbon paper.

4. The method according to claim 1, wherein the base member includes at least one of graphene or carbon nanotubes.

5. The method according to claim 1, wherein the carrier transport material includes spiro-OMeTAD.

6. The method according to claim 1, further comprising forming a second layer on the base member by coating a solution including a moisture-resistant material.

7. A method for manufacturing a photoelectric conversion element including a first electrode, a second electrode, and a photoelectric conversion layer, the second electrode including a base member and a first material portion, the base member including a plurality of structure bodies including carbon, the first material portion including a carrier transport material and being provided between the structure bodies, the photoelectric conversion layer being provided between the first electrode and the second electrode, the photoelectric conversion layer including a material having a perovskite structure, a length of at least one of the structure bodies in a direction from the first electrode to the second electrode being longer than a length of the first material portion in the direction, the method comprising:

coating a solution including the carrier transport material on the photoelectric conversion layer, the photoelectric conversion layer being provided on the first electrode; and bonding the base member to the photoelectric conversion layer, the base member being impregnated with a solution including the carrier transport material.

* * * * *